United States Patent
Chen

(10) Patent No.: US 8,980,718 B2
(45) Date of Patent: Mar. 17, 2015

(54) PMOS TRANSISTORS AND FABRICATION METHOD

(71) Applicant: Semiconductor Manufacturing International Corp., Shanghai (CN)

(72) Inventor: Yong Chen, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/737,966

(22) Filed: Jan. 10, 2013

(65) Prior Publication Data

US 2014/0048891 A1 Feb. 20, 2014

(30) Foreign Application Priority Data

Aug. 14, 2012 (CN) .......................... 2012 1 0289305

(51) Int. Cl.
| | | |
|---|---|---|
| H01L 21/336 | (2006.01) | |
| H01L 21/4763 | (2006.01) | |
| H01L 21/02 | (2006.01) | |
| H01L 29/66 | (2006.01) | |
| H01L 29/78 | (2006.01) | |
| H01L 21/28 | (2006.01) | |
| H01L 29/51 | (2006.01) | |

(52) U.S. Cl.
CPC .......... *H01L 29/66575* (2013.01); *H01L 29/78* (2013.01); *H01L 21/28176* (2013.01); *H01L 21/28185* (2013.01); *H01L 29/513* (2013.01); *H01L 29/517* (2013.01); *H01L 29/66545* (2013.01); *Y10S 438/926* (2013.01)
USPC ........... 438/287; 438/926; 438/595; 438/591; 438/663; 438/301; 257/410; 257/E21.12; 257/E21.324; 257/E21.443; 257/E21.453

(58) Field of Classification Search
CPC .................. H01L 29/66545; H01L 29/66871; H01L 21/28141; H01L 29/66575; H01L 29/78; H01L 21/28079; H01L 21/28088
USPC ........... 257/E21.444, E21.453, 410; 438/287, 438/926
See application file for complete search history.

(56) References Cited

U.S. PATENT DOCUMENTS

| | | | | |
|---|---|---|---|---|
| 5,250,467 | A * | 10/1993 | Somekh et al. ............... | 438/643 |
| 6,188,710 | B1 * | 2/2001 | Besaucele et al. .............. | 372/60 |
| 7,812,411 | B2 | 10/2010 | Cheng | |
| 2006/0046448 | A1 * | 3/2006 | Barns et al. .................... | 438/585 |
| 2006/0205123 | A1 * | 9/2006 | Holmes et al. ................ | 438/149 |
| 2007/0080405 | A1 * | 4/2007 | Kotani et al. .................. | 257/368 |
| 2008/0009110 | A1 * | 1/2008 | Chang et al. .................. | 438/197 |
| 2008/0242012 | A1 * | 10/2008 | Pae et al. ........................ | 438/197 |

(Continued)

*Primary Examiner* — Wensing Kuo
*Assistant Examiner* — Moazzam Hossain
(74) *Attorney, Agent, or Firm* — Anova Law Group, PLLC

(57) ABSTRACT

A method is provided for fabricating a PMOS transistor. The method includes providing a semiconductor substrate, and forming a dummy gate structure at least having a dummy gate, a high-K dielectric layer, and a sidewall spacer surrounding the high-K dielectric layer and the dummy gate on the semiconductor substrate. The method also includes forming a source region and a drain region in the semiconductor substrate at both sides of the dummy gate structure by an ion implantation process, and performing a first annealing process to enhance the ion diffusion. Further, the method includes forming an interlayer dielectric layer leveling with the surface of the dummy gate, and forming a trench by removing the dummy gate. Further, the method also includes performing a second annealing process, and forming a metal gate in the trench.

13 Claims, 7 Drawing Sheets

(56) References Cited

U.S. PATENT DOCUMENTS

| | | | |
|---|---|---|---|
| 2009/0108294 A1* | 4/2009 | Choi et al. | 257/190 |
| 2009/0121297 A1* | 5/2009 | Dewey et al. | 257/411 |
| 2010/0075507 A1* | 3/2010 | Chang et al. | 438/763 |
| 2010/0078767 A1* | 4/2010 | Park | 257/617 |
| 2010/0087056 A1* | 4/2010 | Chung et al. | 438/585 |
| 2011/0221009 A1* | 9/2011 | Chuang et al. | 257/392 |
| 2012/0315749 A1* | 12/2012 | Hempel et al. | 438/591 |
| 2013/0109166 A1* | 5/2013 | Triyoso et al. | 438/591 |
| 2013/0264652 A1* | 10/2013 | Zhu et al. | 257/369 |

\* cited by examiner

PMOS TRANSISTORS AND FABRICATION METHOD

CROSS-REFERENCES TO RELATED APPLICATIONS

This application claims the priority of Chinese patent application No. 201210289305.X, filed on Aug. 14, 2012, the entirety of which is incorporated herein by reference.

FIELD OF THE INVENTION

The present invention generally relates to the field of semiconductor technology, and more particularly, relates to PMOS transistors and techniques for fabricating high-performance PMOS transistors.

BACKGROUND

With the continuously shrinking of the size of semiconductor devices, the conventional gate dielectric material made of silicon oxide becomes thinner and thinner, thus problems such as power consumption wasting and heat generation have emerged. These problems may have been solved by the hafnium-based high-K dielectric material and metal gate process. For example, the switching power consumption and the leakage current from source to drain of transistors formed by the new type of 45 nm process which uses the hafnium-based high-K dielectric material and metal gate process are reduced, the leakage current of the gate oxide layer is also reduced, and the switching speed of the transistors is significantly increased.

However, the performance of PMOS transistors formed by the existing fabrication processes including the above mentioned hafnium-based high-K dielectric and metal gate process may still need improvements. Therefore, new techniques for fabricating PMOS transistors are needed to improve the performance characteristics of PMOS transistors. The disclosed methods and systems are directed to solve one or more problems set forth above and other problems.

BRIEF SUMMARY OF THE DISCLOSURE

One aspect of the present disclosure includes a method for fabricating a PMOS transistor. The method includes providing a semiconductor substrate, and forming a dummy gate structure having at least a dummy gate, a high-K dielectric layer, and a sidewall spacer on the semiconductor substrate surrounding the dummy gate structure. The method also includes forming a source region and a drain region in the semiconductor substrate at both sides of the dummy gate structure by an ion implantation process, and performing a first annealing process to enhance the ion diffusion. Further, the method includes forming an interlayer dielectric layer leveling with the surface of the dummy gate, and forming a trench by removing the dummy gate. Further, the method also includes performing a second annealing process, and forming a metal gate in the trench.

Another aspect of the present disclosure includes a PMOS transistor. The PMOS transistor includes a semiconductor substrate, a source region, a drain region, and a gate structure having at least a high-K dielectric layer and a metal gate. The PMOS transistor also includes a sidewall spacer covering the gate structure, and an interlayer dielectric layer leveling with the metal gate. Further, the PMOS transistor includes a metal silicide layer on the source region and the drain region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

When forming PMOS transistors using high-K dielectric materials, the performance of the PMOS transistors may be impacted by the oxygen vacancies in the high-K dielectric material. If the high-K dielectric material contains oxygen, it may be unstable. On one hand, the high-K dielectric material may be formed by an atomic layer deposition(ALD) process, the ALD process may cause the high-K dielectric material containing oxygen to lose certain amount of oxygen molecules during the deposition process, and cause the obtained high-K dielectric layer to have an oxygen deficiency phenomenon, so-called oxygen vacancy. On the other hand, after an ion implantation process to form a source region and a drain region, a thermal annealing process may be performed to cause implanted ions to diffuse. Because the temperature of the thermal annealing process is relatively high, for example, the temperature may be in a range of approximately 1000° C.~1100° C., the thermal annealing process may cause the oxygen molecules to decompose and escape so as to form oxygen vacancies in the obtained high-K dielectric layer. The oxygen vacancy phenomenon may cause decreased effective working function of the PMOS transistor and higher threshold voltage of the PMOS transistor. Thus, the performance of PMOS transistors would be affected.

Figure 1:
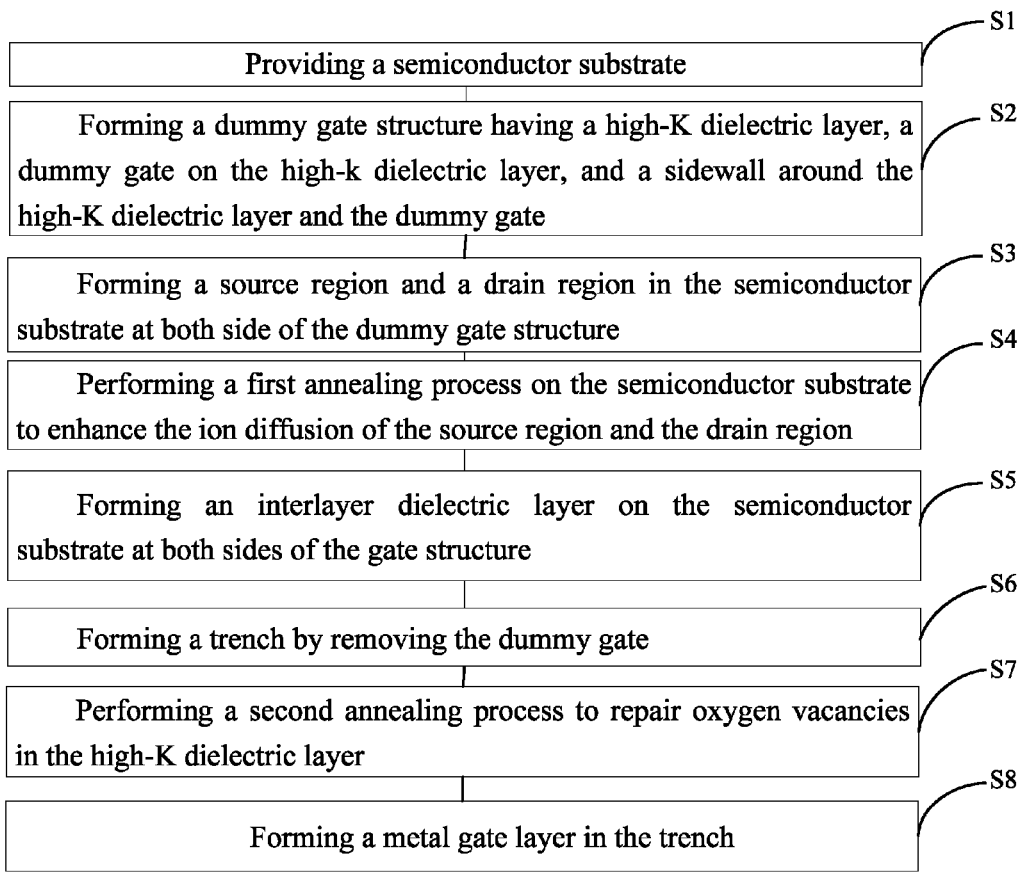
FIG. 1 illustrates an exemplary fabrication process of a PMOS transistor consistent with the disclosed embodiments.

FIG. 1 illustrates an exemplary fabrication process of a PMOS transistor, and FIGS. 2-18 illustrate the semiconductor structures corresponding to certain stages of the exemplary fabrication process consistent with the disclosed embodiments.

Figure 2:
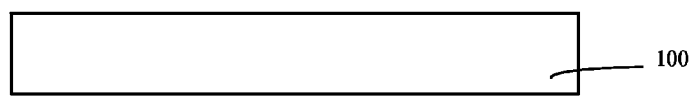
FIGS. 2-18 illustrate semiconductor structures corresponding to certain stages of an exemplary fabrication process of a PMOS transistor consistent with the disclosed embodiments.

As shown in FIG. 1, at the beginning of the fabrication process, a semiconductor substrate is provided (S1). FIG. 2 shows a corresponding semiconductor structure.

As shown in FIG. 2, a semiconductor substrate 100 is provided. The semiconductor substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, or silicon on insulator (SOI). In one embodiment, the semiconductor substrate 100 is silicon or SOI. The semiconductor substrate 100 may also provide a base for subsequent processes and structures.

Figure 3:
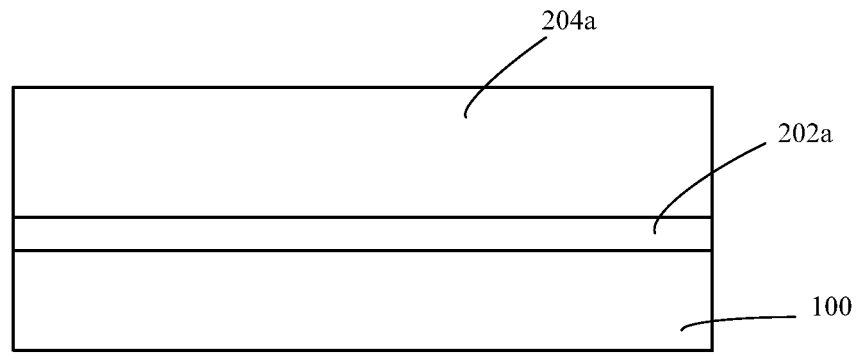
Figure 4:
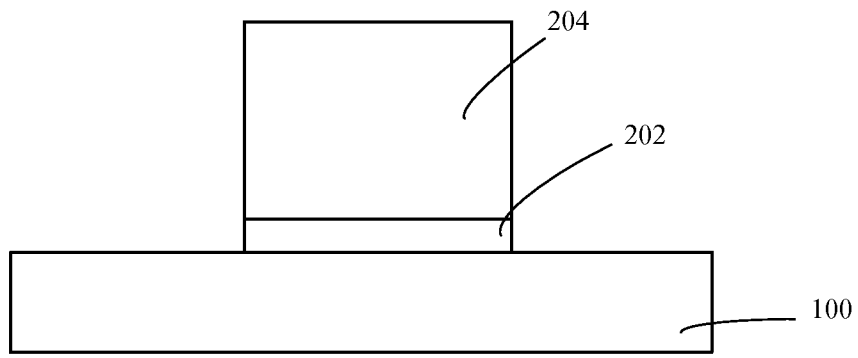
Figure 5:
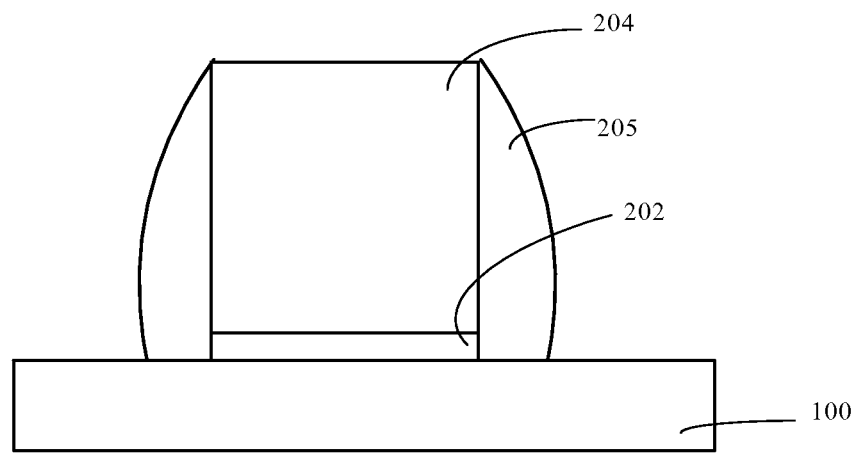

Returning to FIG. 1, after providing the semiconductor substrate 100, a dummy gate structure may be formed on the semiconductor substrate 100 (S2). FIGS. 3-5 show corresponding semiconductor structures.

As shown in FIG. 5, a dummy gate structure is formed on the semiconductor substrate 100. The dummy gate structure may have a high-K dielectric layer 202 on the semiconductor substrate 100, a dummy gate 204 on the high-K dielectric layer 202, and a sidewall spacer 205 surrounding the high-K dielectric layer 202 and the dummy gate 204.

Various methods may be used to form the dummy gate structure. In one embodiment, as shown in FIG. 3, the method for forming the dummy gate structure sequentially includes: forming a high-K dielectric material layer 202a on the semiconductor substrate 100; and forming a dummy gate material layer 204a on the high-k dielectric material layer 202a.

Various fabrication processes may be used to form the high-K dielectric material layer 202a and the dummy gate material layer 204a, such a chemical vapor deposition process (CVD), a physical vapor deposition process (PVD), or any other appropriate process. The high-K dielectric material layer 202a may be made of any appropriate dielectric material, such as hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite, or lead zinc niobate, etc. In one embodiment, the high-K dielectric material may be at least one of hafnium dioxide and zirconium oxide. The dummy gate material layer 204a may be made of any appropriate material, such as poly silicon (so called dummy poly), or metal materials, etc.

Further, as shown in FIG. 4, the method also includes patterning the high-K dielectric material layer 202a and the dummy gate material layer 204a to form the high-K dielectric layer 202 and the dummy gate 204. Afterwards, the sidewall spacer 205 surrounding the high-K dielectric layer 202 and the dummy gate 204 are formed, as shown in FIG. 5.

The high-K dielectric material layer 202a and the dummy gate layer 204a may be patterned by any appropriate process, such as a dry etching process including a reactive ion etching process or an ion beam etching process, etc., or a wet etching process using any appropriate etching solution.

The sidewall spacer 205 may be made of any appropriate material, such as silicon oxide, silicon nitride, or a combination thereof. The sidewall spacer 205 may be formed by any appropriate process, such as an etch back process, i.e., depositing an sidewall spacer material layer on the top surface of the dummy gate 204, the side surface of the dummy gate 204 and the side surface of the high-K dielectric layer 202, and etching the portion of the sidewall spacer material layer on the top surface of the dummy gate 204 and keep a portion of the sidewall spacer material layer on the side surfaces of the dummy gate 204 and the high-K dielectric layer 202.

Figure 6:
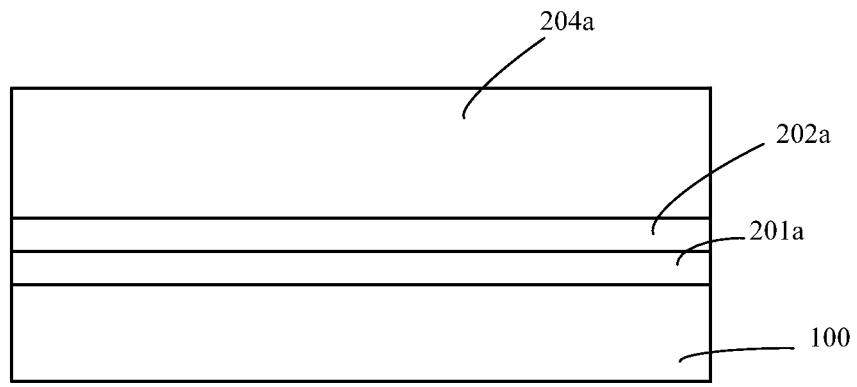
Figure 7:
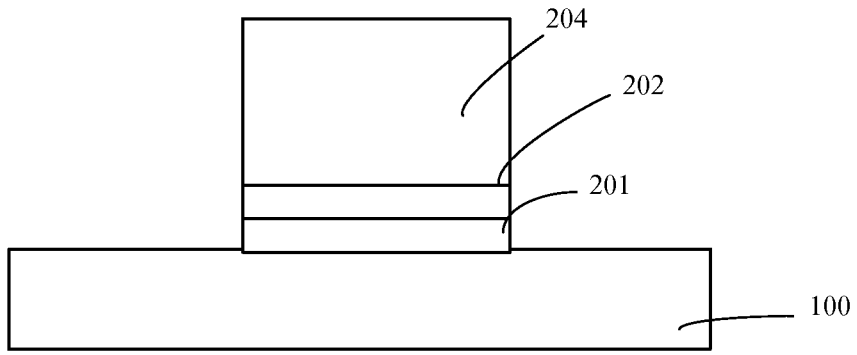
Figure 8:
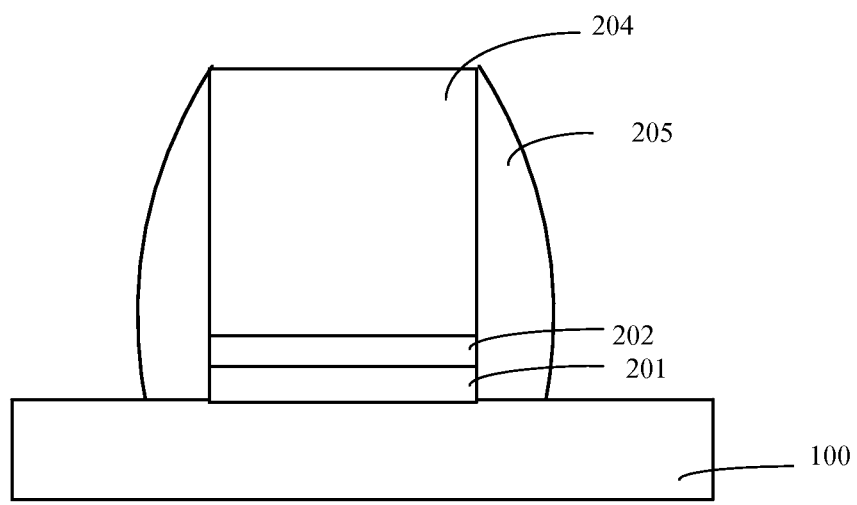

Alternatively or optionally, an interface layer may be formed between the high-K dielectric layer 202 and the semiconductor substrate 100. FIGS. 6-8 illustrate corresponding structures. As shown in FIG. 8, an interface layer 201 may be formed between the high-K dielectric layer 202 and the semiconductor substrate 100.

The method for forming the dummy gate structure with the interface layer 201 may sequentially include, as shown in FIG. 6, forming an interface material layer 201a on the substrate 100; forming a high-K dielectric material layer 202a on the interface material layer 201a; and forming a dummy gate material layer 204a on the high-K dielectric material layer 202a.

The interface material layer 201 a may be formed by any appropriate process, such as a chemical vapor deposition process (CVD), a physical vapor deposition process (PVD), an atomic layer deposition process, a thermal oxidation process, or a chemical oxidation process etc.

Various fabrication processes may be used to form the high-K dielectric material layer 202a and the dummy gate material layer 204a, such as a CVD process, a PVD process, and any other appropriate process. The interface material layer 201 may be made of any appropriate material such as silicon oxide, or silicon nitride, etc. In one embodiment, the interface material layer is silicon oxide.

The high-K dielectric material layer 202a may be made of any appropriate dielectric material, such as hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite, or lead zinc niobate, etc.

In one embodiment, the high-K dielectric material may be made of at least one of hafnium dioxide and zirconium oxide. The dummy gate material layer 204a may be made of any appropriate material, such as poly silicon (so called dummy poly), or metal materials, etc.

Further, as shown in FIG. 7, the method for forming the dummy gate structure with the interface layer 201 may also include patterning the interface material layer 201 a, the high-K dielectric material layer 202a and the dummy gate material layer 204a to form the interface layer 201, the high-K dielectric layer 202 and the dummy gate 204.

The interface material layer 201 a, the high-K dielectric material layer 202a and the dummy gate layer 204a may be patterned by any appropriate process, such as a dry etching process including a reactive ion etching process or an ion beam etching process, etc., or a wet etching process using any appropriate etching solution.

Further, shown in FIG. 8, the method for forming the dummy gate structure with the interface layer 201 may include forming a sidewall spacer 205 surrounding the interface layer 201, the high-K dielectric layer 202 and the dummy gate 204. The sidewall spacer 205 may be made of any appropriate materials, such as silicon oxide, silicon nitride, silicon oxynitride, or a combination thereof The sidewall spacer 205 may be formed by any appropriate process, such as an etch back process, i.e., depositing a sidewall spacer material layer on the top surface of the dummy gate 204, the side surface of the dummy gate 204, the side surface of the high-K dielectric layer 202 and the side surface of the interface layer 201, and etching the portion of the sidewall spacer material layer on the top surface of the dummy gate 204, and keeping a portion of the sidewall spacer material layer on the side surfaces of the dummy gate 204, the high-K dielectric layer 202 and the interface layer 201.

It should be noted that, when the interface layer 201 is silicon oxide, the interface layer 201 may cause the interface state of the interface between the substrate 100 and the interface layer 201 to be a fast interface state, and the charge exchanging of conduction band and/or valance band may be speeded up. Thus, the interface layer 201 may increase the carrier mobility of the electrons and holes of the interface.

Figure 9:
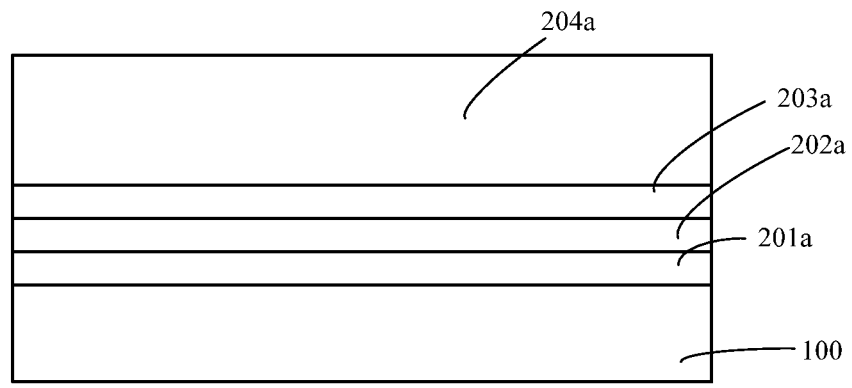
Figure 10:
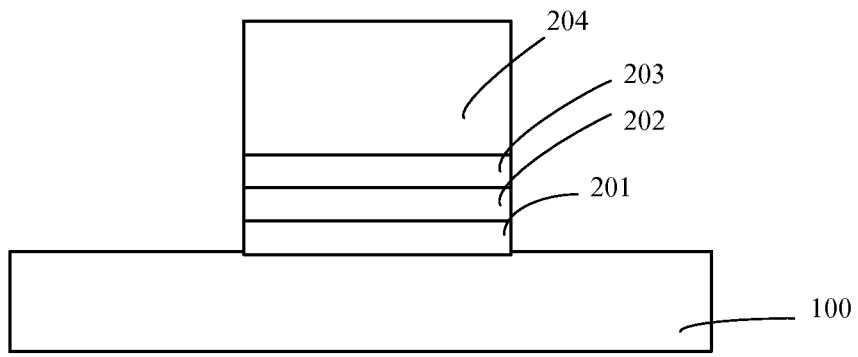
Figure 11:
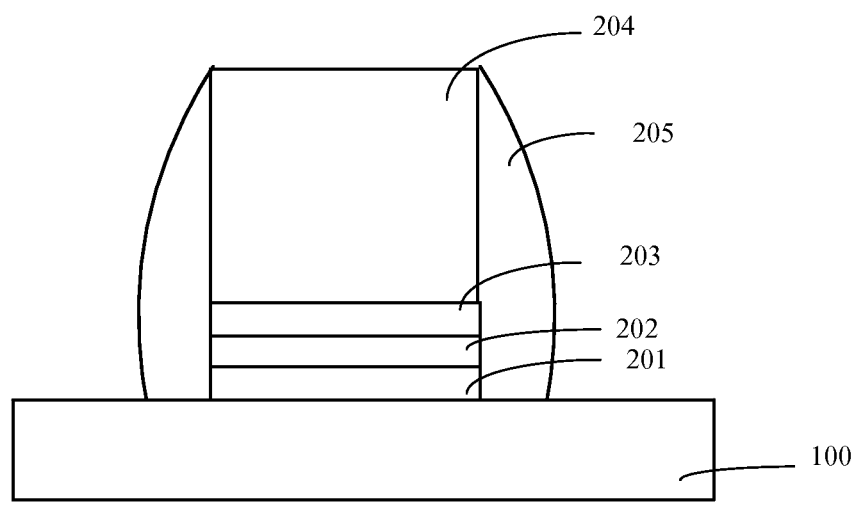

Alternatively or optionally, a capping layer may be formed between the high-K dielectric layer and the dummy gate. FIGS. 9-11 illustrate corresponding structures. As shown in FIG. 11, a capping layer 203 may be formed between the high-K dielectric layer 202 and the dummy gate 204 besides the interface layer 203 between the high-K dielectric layer 202 and the semiconductor substrate 100.

The method for forming the dummy gate structure with the capping layer 203 and the interface layer 201 may sequentially include, as shown in FIG. 9, forming an interface material layer 201a on the substrate 100; forming a high-K dielectric material layer 202a on the interface material layer 201a; forming a capping material layer 203a on the high-K dielectric material layer 202a; and forming a dummy gate material layer 204a on the capping material layer 203a.

The interface material layer 201a may be formed by any appropriate process, such as a chemical vapor deposition process (CVD), a physical vapor deposition process (PVD), an atomic layer deposition process, a thermal oxidation process, and a chemical oxidation process etc. Various fabrication processes may be used to form the high-K dielectric material layer 202a the capping material layer 203a and the dummy gate material layer 204a, such as a CVD process, a PVD process, or any other appropriate process.

The interface material layer 201a may be made of any appropriate material, such as silicon oxide, silicon nitride, or silicon oxynitride, etc. In one embodiment, the interface material layer 201a is silicon oxide. The high-K dielectric material layer 202a may be made of any appropriate dielectric material, such as hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite, or lead zinc niobate, etc.

In one embodiment, the high-K dielectric material may be made of at least one of hafnium dioxide and zirconium oxide. The capping material layer 203a may be made of any one of titanium nitride, thallium nitride, titanium aluminum alloy, or a combination thereof. The dummy gate material layer 204a may be made of any appropriate material, such as poly silicon (so called dummy poly), or metal materials, etc.

As shown in FIG. 10, the method for forming the dummy gate structure with the capping layer 203 and the interface layer 201 may also include patterning the interface material layer 201a, the high-K dielectric material layer 202a, the capping material layer 203a and the dummy gate material layer 204a to form the interface layer 201, the high-K dielectric layer 202, the capping layer 203 and the dummy gate 204.

The interface material layer 201a, the high-K dielectric material layer 202a, the capping material layer 203a and the dummy gate layer 204a may be patterned by any appropriate process, such as a dry etching process including a reactive ion etching processor an ion beam etching process, etc., or a wet etching process using any appropriate etching solution.

Further, as shown in FIG. 11, the method for forming the dummy gate structure with the capping layer 201 and the interface layer 203 may include forming a sidewall spacer 205 surrounding the interface layer 201, the high-K dielectric layer 202, the capping layer 203 and the dummy gate 204. The sidewall spacer 205 may be made of any appropriate material, such as silicon oxide, silicon nitride, or a combination thereof.

The sidewall spacer 205 may be formed by any appropriate process, such as an etch back process, i.e., depositing a sidewall spacer material layer on the top surface of the dummy gate 204, the side surface of the dummy gate 204, the side surface of the high-K dielectric layer 202, the side surface of the capping layer 203 and the side surface of the interface layer 201, and etching the portion of the sidewall spacer material layer on the top surface of the dummy gate 204 and keep a portion of the sidewall spacer material layer on the side surfaces of the dummy gate 204, the capping layer 203, the high-K dielectric layer 202 and the interface layer 201.

The capping layer 203 may be used as an etching stop layer for subsequently removing the dummy gate 204, i.e., the etching process may be stopped when it reaches the capping layer 203. The using of the capping layer 203 as the etching stop layer may prevent the high-K dielectric layer 203 being damaged when the dummy gate 204 is removed.

Figure 12:
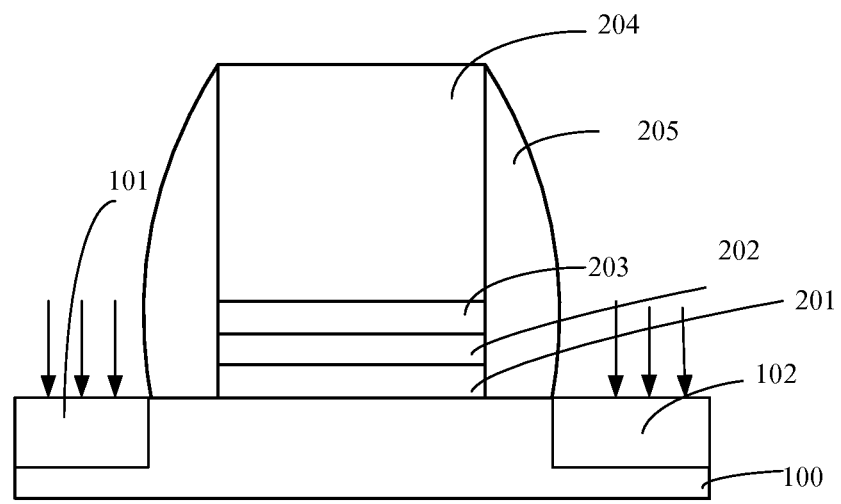

Returning to FIG. 1, after forming the dummy gate structure, an ion implantation process may be performed to the substrate 100 at both sides of the dummy gate structure to form a source region and a drain region (S3). FIG. 12 shows a corresponding semiconductor structure.

As shown in FIG. 12, a source region 101 and a drain region 102 may be formed in the substrate 100 at both sides of the dummy gate structure by an ion implantation process. Various types of ions may be used to form the desired type doped source region 101 and drain region 102. When the P-type doped source region 101 and/or drain region 102 are formed, the dopant may be any appropriate trivalent ion, such as boron ion, etc. When the N-type doped source region 101 and/or drain region 102 are formed, the dopant may be any appropriate pentavalence ion, such as phosphorous ion, or arsenic ion, etc.

Returning to FIG. 1, after forming the source region 101 and the drain region 102, a first annealing process may be performed to the semiconductor substrate 100 (S4). The annealing process may enhance the ion diffusion of the source region 101 and the drain region 102. An annealing temperature may be in a range of approximately 1000° C.~1100° C. A duration of the annealing may be in a range of approximately 0~2 s.

The temperature of the first annealing is relatively high, the oxygen element of the high-K dielectric layer 202 may decompose and escape under the high temperature, producing oxygen vacancies in the high-K dielectric layer 202. As mentioned earlier, the oxygen vacancies may reduce the work function and the threshold voltage of the formed PMOS transistor, thus lower the performance.

Figure 13:
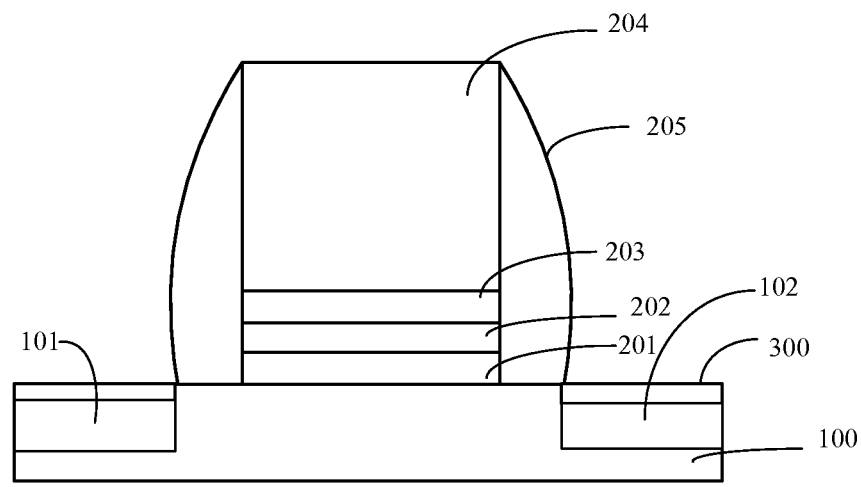

Referring to FIG. 13, in one embodiment, a metal silicide layer 300 may be formed on the source region 101 and the drain region 102 at both sides of the dummy gate structure after the first annealing process and before forming an interlayer dielectric layer. The metal silicide layer 300 may be made of any appropriate material, such as nickel silicide, copper silicide, or cobalt silicide, etc. In one embodiment, the metal silicide is nickel silicide. The metal silicide layer 300 may be used to reduce the contact resistance of the subsequently formed conductive plugs.

Figure 14:
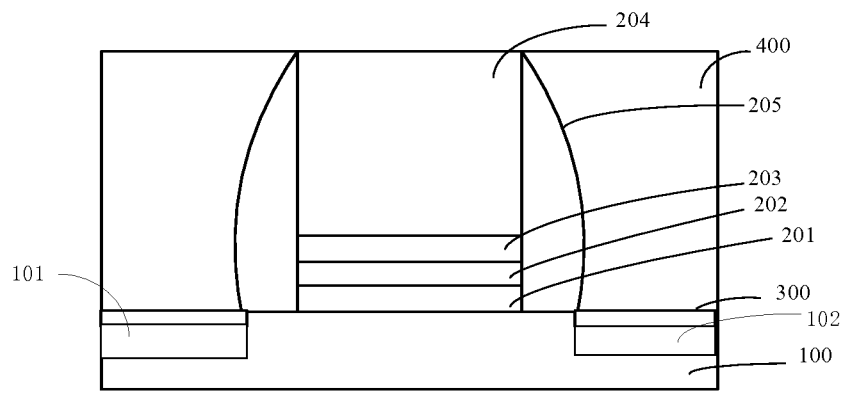

Returning to FIG. 1, after forming the metal silicide layer 300, an interlayer dietric layer may be formed on the substrate 100 at both sides of the dummy gate structure (S5). FIG. 14 shows a corresponding semiconductor structure.

As shown in FIG. 14, an interlayer dielectric layer 400 may be formed on the substrate 100 at both sides of the dummy gate structure. The top surface of the interlayer dielectric layer 400 may be leveled with the top surface of the dummy gate 204. The interlayer dielectric layer 400 may be made of any appropriate material, such as silicon oxide, silicon nitride, or silicon oxynitride, etc.

In one embodiment, the interlayer dielectric layer 400 is made of silicon oxide. The interlayer dielectric layer 400 may be made of any appropriate process, such as a CVD process, or a PVD process, etc. In order to make the top surface of the interlayer dielectric layer to be leveled with the top surface of the dummy gate 204, a chemical mechanical polishing (CMP) process may be used after depositing an interlayer dielectric material layer, and the CMP process may be stopped when a portion of the interlayer dielectric material on the top of the dummy gate 204 is completely removed. Optionally, when the CVD process is used, an etching gas may be added into the reactive gas to prevent the interlayer dielectric layer growing on the top surface of the dummy gate 204, and the interlayer dielectric layer 400 may be only formed on the substrate 100 at both sides of the dummy gate structure.

Figure 15:
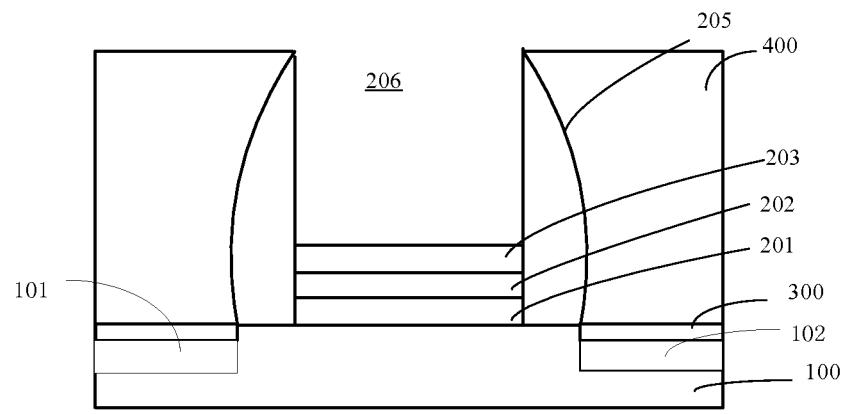

Returning to FIG. 1, after forming the interlayer dielectric layer 400, the dummy gate 204 may be removed (S6). FIG. 15 shows a corresponding semiconductor structure.

As shown in FIG. 15, the dummy gate 204 is removed, and a trench 206 may be formed. The trench 206 may be used to form a metal gate. Various fabrication processes may be used to remove the dummy gate 204, such as a dry etching process including a plasma etching process and an ion beam etching process, etc., and a wet etching process. In one embodiment, the dummy gate 204 is removed by a dry etching process.

If there is a capping layer 203 between the dummy gate 204 and the high-K dielectric layer 202, the capping layer 203 may protect the high-K dielectric layer 202 when the dummy gate 204 is removed. A thickness of the capping layer may in a range of approximately 10 Å~20 Å.

Returning to FIG. 1, after removing the dummy gate 204 and forming the trench 206, a second annealing process may be performed to repair the oxygen vacancies in the high-K dielectric layer 202 (S7). Various environmental gases may be used in the second annealing process. In one embodiment, the environmental gas is oxygen. The gas flow of the oxygen may be in a range of approximately 1 sccm~100 sccm. An annealing temperature may be in a range of approximately 400° C.~600° C. An annealing time may be in a range of 5 s~100 s.

In another embodiment, the environmental gas of the second annealing process may be a mixture of oxygen and nitrogen. The nitrogen may be used to dilute the oxygen to prevent the high-K dielectric layer being over-oxidized. A concentration of oxygen in the mixture may be in a range of approximately 1 ppm~1000 ppm. Other appropriate gases may also be used to dilute the oxygen.

In the second annealing process, the oxygen atoms may penetrate through the capping layer 203 to react with the high-K dielectric layer 202, and fill the oxygen vacancies in the high-K dielectric layer 202. Thus, the second annealing process under the oxygen environment may repair the oxygen vacancies in the high-K dielectric layer 202 caused by the first annealing process for the ion diffusion, and ensure the formed PMOS transistor to have a better performance.

In addition, the temperature of the second annealing process may be relatively low, the concentration of the oxygen may be relatively low if the diluted oxygen is used, and the annealing time may be relatively short. Thus, the second annealing process may repair the oxygen vacancies in the high-k dielectric layer 202 without oxidizing the capping layer 203.

Figure 16:
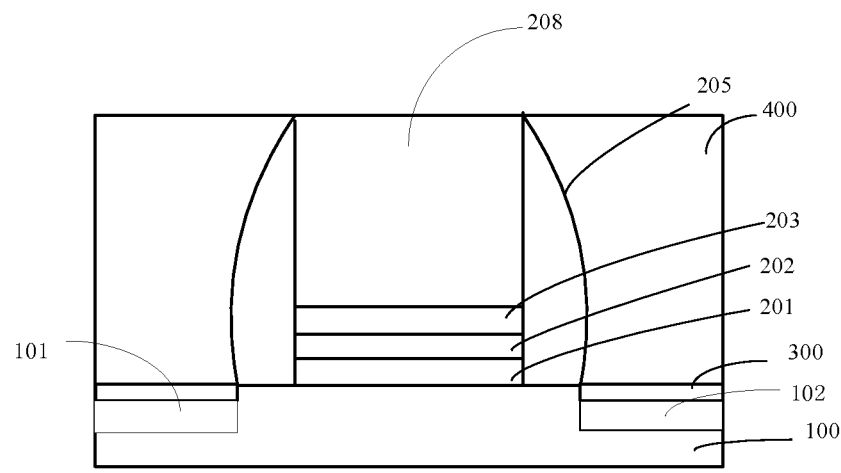

Returning to FIG. 1, after the second annealing process, a metal gate may be formed in the trench 206 (S8). FIG. 16 shows a corresponding semiconductor structure.

As shown in FIG. 16, a metal gate 208 may be formed in the trench 206. After forming the metal gate 208, a PMOS transistor is completely formed. The metal gate 208 may be made of any appropriate material, such as aluminum, copper, silver, gold, platinum, nickel, titanium, thallium, tantalum, tungsten, tungsten silicide, titanium tungsten alloy, titanium nitride, thallium nitride, thallium carbide, nickel platinum ally, or thallium nitrate silicate, etc. The metal gate 208 may be formed by any appropriate process, such as a CVD process or a PVD process, etc.

In one embodiment, a work function layer 207 may be formed on the high-K dielectric layer 202 after the second annealing process and before forming the metal gate 208.

Figure 17:
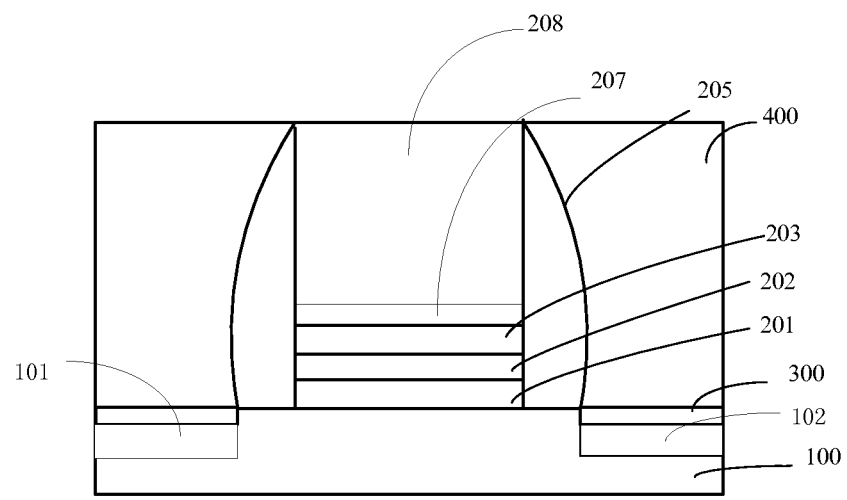
Figure 18:
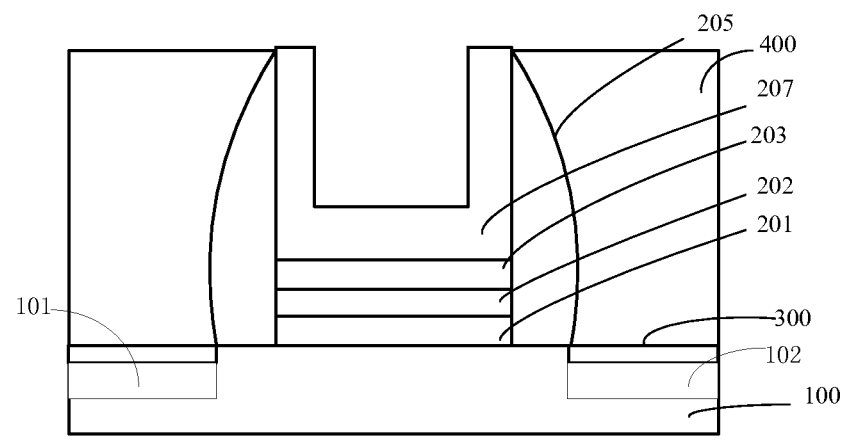

The work function layer 207 may be formed only on the bottom of the trench 206, as shown in FIG. 17. Alternatively, the work function layer 207 may be formed on both the bottom and the sidewall of the trench 206, as shown in FIG. 18. The work function layer 207 may be made of any appropriate material, such as titanium nitride, thallium nitride, or titanium aluminum alloy, etc. Various fabrication processes may be used to form the work function layer 207, such as a CVD process, or a PVD process, etc.

In the disclosed embodiments, the second annealing process may be performed after removing the dummy gate 204. The second annealing process may repair the oxygen vacancies in the high-K dielectric layer 202, thus the problems, such as the reduction of the work function and the threshold voltage of the PMOS transistor, caused by the oxygen vacancies may be prevented. In addition, the temperature of the second annealing process may be relatively low, the oxygen concentration may be relatively low if the diluted oxygen is used, and the annealing time may relatively short, therefore the oxygen vacancies in the high-K dielectric layer 202 may be repaired without oxidizing the capping layer 203.

In another embodiment, a PMOS transistor may be formed by the above disclosed processes and methods; the corresponding PMOS transistor is illustrated in FIG. 17. The PMOS transistor includes the substrate 100, the source region 101 and the drain region 102, and the gate structure having the interface layer 201, the high-K dielectric layer 202, the capping layer 203, the work function layer 204 and the metal gate 208. The PMOS transistor also includes the sidewall spacer 205 surrounding the gate structure, and the interlayer dielectric layer 400 leveling with the metal gate 208. Further, the PMOS transistor includes the metal silicide layer 300 on the source region 101 and the drain region 102. The detailed structures and intermediate structures are described above with respect to the fabrication methods.

It should be understood that the specification is described by exemplary embodiments, but it is not necessary that each embodiment includes an independent technical solution. Those skilled in the art can understand the specification as whole and technical features in the various embodiments can be combined to other embodiments understandable to other persons of ordinary skill in the art.

The above detailed descriptions only illustrate certain exemplary embodiments of the present invention, and are not intended to limit the scope of the present invention. Any equivalent or modification thereof, without departing the sprint and principle of the present invention, falls within the true scope of the present invention.

What is claimed is:

1. A method for forming a PMOS transistor, comprising:
    providing a semiconductor substrate;
    forming a dummy gate structure having a dummy gate, a high-K dielectric layer, a capping layer, and a sidewall spacer on the semiconductor substrate, wherein the dummy gate is formed directly on the capping layer, which is formed directly on the high-K dielectric layer;
    forming a source region and a drain region in the semiconductor substrate at both sides of the dummy gate structure by an ion implantation process;
    performing a first annealing process to enhance the ion diffusion of the source region and the drain region;
    forming an interlayer dielectric layer coplanar with the top surface of the dummy gate;
    removing the dummy gate to form a trench exposing the capping layer and exposing a portion of the sidewall spacer, wherein the sidewall spacer is made of silicon nitride;
    performing a second annealing process to the exposed capping layer on the high-K dielectric layer, after removing the dummy gate, such that oxygen atoms from an environmental gas of the second annealing process penetrate through the exposed capping layer to react with the high-K dielectric layer underlying the capping layer to repair oxygen vacancies in the high-K dielectric layer for the PMOS transistor; and forming a metal gate in the trench.

2. The method according to claim 1, wherein:
the high-K dielectric layer is made of an oxygen-containing high-K dielectric material including at least one of hafnium oxide and zirconium oxide, and oxygen vacancies in the high-K dielectric layer are repaired by the second annealing process.

3. The method according to claim 1, wherein:
an oxygen flow of the second annealing process is in a range of approximately 1 sccm -100 sccm;
an annealing temperature is in a range of approximately 400° C. -600° C.;
an annealing environment pressure is in a range of approximately 100 Torr -700 Torr; and
an annealing time is in a range of approximately 5 s -100 s.

4. The method according to claim 3, wherein:
the environmental gas of the second annealing process includes nitrogen-diluted oxygen at a concentration of approximately 1 pm -1000 pm.

5. The method according to claim 1, wherein the forming of the dummy gate structure further includes:
forming a high-K dielectric material layer on the semiconductor substrate;
forming a dummy gate material layer on the high-k dielectric material layer;
patterning the high-K dielectric material layer and the dummy gate material layer to form the high dielectric layer and the dummy gate; and
forming the sidewall spacer surrounding the high-K dielectric layer and the dummy gate.

6. The method according to claim 1, wherein the forming of the dummy gate structure further includes:
forming an interface material layer on the semiconductor substrate;
forming a high-K dielectric material layer on the interface material layer;
forming a dummy gate material layer on the high-K dielectric material layer;
patterning the interface material layer, the high-K dielectric material layer and the dummy gate material layer to form the interface layer, the high dielectric layer and the dummy gate; and
forming the sidewall spacer surrounding the interface layer, the high-K dielectric layer and the dummy gate.

7. The method according to claim 6, wherein:
the interface layer is made of silicon oxide.

8. The method according to claim 1, wherein the forming of the dummy gate structure further includes:
forming an interface material layer on the semiconductor substrate;
forming a high-K dielectric material layer on the interface material layer;
forming a capping material layer on the high-K dielectric material layer;
forming a dummy gate material layer on the capping material layer;
patterning the interface material layer, the high-K dielectric material layer, the capping material layer and the dummy gate material layer to form the interface layer, the high dielectric layer, the capping layer and the dummy gate; and
forming the sidewall spacer surrounding the interface layer, the high-K dielectric layer, the capping layer and the dummy gate.

9. The method according to claim 8, wherein:
the capping layer is made of titanium nitride or thallium nitride.

10. The method according to claim 1, wherein after performing the first annealing process and before forming the interlayer dielectric layer, further including:
forming a metal silicide layer on the source region and the drain region.

11. The method according claim to 10, wherein:
the metal silicide layer is nickel silicide.

12. The method according claim to 1, after the second annealing process and before forming the metal gate, further including:
forming a work function layer made of titanium nitride on the high-K dielectric layer.

13. The method according to claim 1, wherein:
a temperature of the first annealing process is in a range of approximately 1000 ° C. -1100° C.; and
an annealing time is in a range of approximately 0-2 s.

* * * * *